United States Patent [19]

Shoji

[11] Patent Number: 4,556,805
[45] Date of Patent: Dec. 3, 1985

[54] COMPARATOR CIRCUIT HAVING HYSTERESIS VOLTAGE SUBSTANTIALLY INDEPENDENT OF VARIATION IN POWER SUPPLY VOLTAGE

[75] Inventor: Masashi Shoji, Tokyo, Japan

[73] Assignee: NEC Corporation, Tokyo, Japan

[21] Appl. No.: 529,880

[22] Filed: Sep. 6, 1983

[30] Foreign Application Priority Data

Sep. 7, 1982 [JP] Japan .................................. 57-155466

[51] Int. Cl.⁴ ............................................ H03K 5/153
[52] U.S. Cl. .................................. 307/359; 307/362; 307/567
[58] Field of Search ............... 307/359, 362, 354, 290, 307/567, 565; 328/150, 146, 147

[56] References Cited

U.S. PATENT DOCUMENTS 3,309,618  3/1967  Harris et al. ........................ 307/359
3,916,328  10/1975  Wilson .............................. 307/354

Primary Examiner—John Zazworsky
Attorney, Agent, or Firm—Laff, Whitesel, Conte & Saret

[57] ABSTRACT

A comparator circuit provided with a hysteresis characteristic comprises an amplifier comparing an input voltage with a reference voltage, a voltage-clamping circuit clamping the output voltage of the amplifier at a first stabilized voltage or at a second stabilized voltage in response to the comparison output of the amplifier, and a feedback circuit generating a first feedback voltage or a second feedback voltage as the reference voltage in response to the output voltage level of the amplifier, whereby the hysteresis voltage of the comparator circuit is substantially independent of the variation in a power supply voltage for actuating the comparator circuit.

14 Claims, 4 Drawing Figures

COMPARATOR CIRCUIT HAVING HYSTERESIS VOLTAGE SUBSTANTIALLY INDEPENDENT OF VARIATION IN POWER SUPPLY VOLTAGE

BACKGROUND OF THE INVENTION

The present invention relates to a comparator circuit, and more particularly to a comparator circuit having a hysteresis characteristic, wherein an input signal voltage causing an output voltage to be inverted from a first level to a second level is different from an input signal causing that to be inverted from the second level to the first level.

A conventional comparator circuit having a hysteresis characteristic comprises an amplifier having a first and second input ends and an output end, and a feedback circuit connected between the output and the second input ends of the amplifier to supply a comparison voltage corresponding to the voltage level at the output end. The first input end of the amplifier is supplied with an input signal. The feedback circuit comprises first and second resistors and a reference voltage source. The first and second resistors are series-connected between the output end of the amplifier and the reference voltage source. The connecting point between the first and second resistors is connected to the second input end of the amplifier.

The input signal voltage supplied to the first input end is compared with the comparison voltage at the second input end by the amplifier to produce an output voltage of first or second level at the output end of the amplifier in response to the relationship of the input signal voltage to the voltage at the second input end. Since the second input end of the amplifier is connected to the connecting point between the first and second resistors which are series-connected between the output end and the reference voltage source, the second input end is supplied with a first or second threshold voltage determined by the first and second levels of the output voltage at the output end. In other words, the comparator circuit has first and second threshold voltages different in voltage level from each other. In consequence, there is a difference in voltage between a first input signal voltage causing a change of the output voltage from the first level to the second level and a second input signal voltage causing a change of the output voltage from the second level to the first level. The voltage difference between the first and second input signal voltages (i.e., the voltage difference between the first and second threshold voltages) is called as a "hysteresis voltage". The hysteresis voltage determines a voltage range of the input signal voltage which does not change the output voltage after the output voltage is changed.

However, the first and second levels of the output voltage depend on the power supply voltage supplied for actuating the comparator circuit. In other words, the first and second threshold voltages of the comparator circuit have a dependence on the power supply voltage. As a result, the hysteresis voltage is also changed in response to the variation in the power supply voltage. The value of the hysteresis voltage is determined by the resistance ratio between the first and second resistors as well as the power supply voltage. If the resistance ratio is increased, the hysteresis voltage is decreased. If a high power supply voltage is supplied to the comparator circuit, the small hysteresis voltage can be obtained by increasing largely the resistance ratio. However, the resistance ratio between two resistors actually formed in a semiconductor integrated circuit device has a deviation from a value designed therefor, and the deviation becomes larger as the resistance ratio is larger. Moreover, a resistor having a high resistance value occupies a large area on the semiconductor substrate and is not suitable for an element on the semiconductor integrated circuit device. Consequently, the deviation of the hysteresis voltage becomes large, and the advantages of the formation of the comparator circuit as a semiconductor integrated circuit are lost.

SUMMARY OF THE INVENTION

Accordingly, it is an object of the invention to provide a comparator circuit having a hysteresis voltage substantially independent of a power supply voltage.

It is another object of the invention to provide a comparator circuit having a hysteresis voltage which has a small deviation.

It is still another object of the invention to provide a comparator circuit of a hysteresis type suitable for being formed as a semiconductor integrated circuit device.

According to the present invention, there is provided a comparator circuit comprising: an amplifier having first and second input ends and an output end and comparing an input signal voltage supplied to the first input end with a threshold voltage supplied to the second input end to produce a first signal having a high voltage at the output end or a second signal having a low voltage at the output end; a voltage-clamping circuit clamping the voltage at the output end at a first stabilized voltage in response to the first signal and that at a second stabilized voltage in response to the second signal; and a feedback circuit supplying the threshold voltage to the second input end, the threshold voltage having a first voltage level corresponding to the first stabilized voltage and a second voltage level corresponding to the second stabilized voltage.

Thus, the comparator circuit in accordance with the present invention is provided with the voltage-clamping circuit. Assuming that the first and second input ends are inverting and non-inverting input ends, respectively, the amplifier produces the first signal to raise the voltage at the output end, when the input signal voltage is lower than the threshold voltage at the second input end. At this moment, however, the voltage at the output end of amplifier is clamped at the first stabilized voltage by the voltage-clamping circuit. The feedback circuit generates the first voltage level corresponding to the first stabilized voltage. In consequence, the second input end of the amplifier takes the first voltage level as the threshold voltage. On the contrary, when the input signal voltage exceeds the threshold voltage (i.e., the first voltage level) at the second input end, the amplifier produces a second signal to lower the voltage at its output end. In response to the second signal, the voltage-clamping circuit clamps the voltage at the amplifier output end at the second stabilized voltage. As a result, the second input end of the amplifier is supplied with the second voltage level corresponding to the second stabilized voltage as the threshold voltage. When the input signal decreases to become smaller than the threshold voltage (i.e., the second voltage level) at the second input end, the amplifier produces the first signal, so that the first voltage level is again supplied to the second input end as the threshold voltage.

Since the first and second stabilized voltages are different from each other, the first and second voltages levels are also different in voltage from each other. Therefore, there is a difference between the input signal voltage causing a change of the voltage at the amplifier output end from the first stabilized voltage to the second stabilized voltage and that causing a change of the voltage from the second stabilized voltage to the first stabilized voltage. In other words, the comparator circuit in accordance with the present invention has a hysteresis characteristic, and the hysteresis voltage equals to a voltage difference between the first and second voltage levels. If the first and second input ends are the non-inverting and inverting input ends, respectively, the variation in the voltage at the output end to the input signal voltage is reversed with respect to the above-described operation.

The first and second voltage levels of the threshold voltage are generated by the feedback circuit in response to the first and second stabilized voltages, respectively. The first and second stabilized voltages are generated by the voltage-clamping circuit and are substantially constant independently of the variation in the power supply voltage supplied for actuating the comparator circuit. Accordingly, the hysteresis voltage of the comparator circuit in accordance with the present invention is substantially constant regardless of the variation in the power supply voltage. In addition, the first and second voltage levels depend on the first and second stabilized voltages. Therefore, the hysteresis circuit in accordance with the invention is suitable for being formed as a semiconductor integrated circuit device, and its hysteresis voltage has a considerably small deviation.

BRIEF DESCRIPTION OF THE DRAWINGS

The above and other objects, features and advantages of the invention will become more apparent from the following description of preferred embodiments of the present invention taken in connection with the accompanying drawings, in which.

DETAILED DESCRIPTION OF THE PREFERRED EMBODIMENTS

Figure 1:
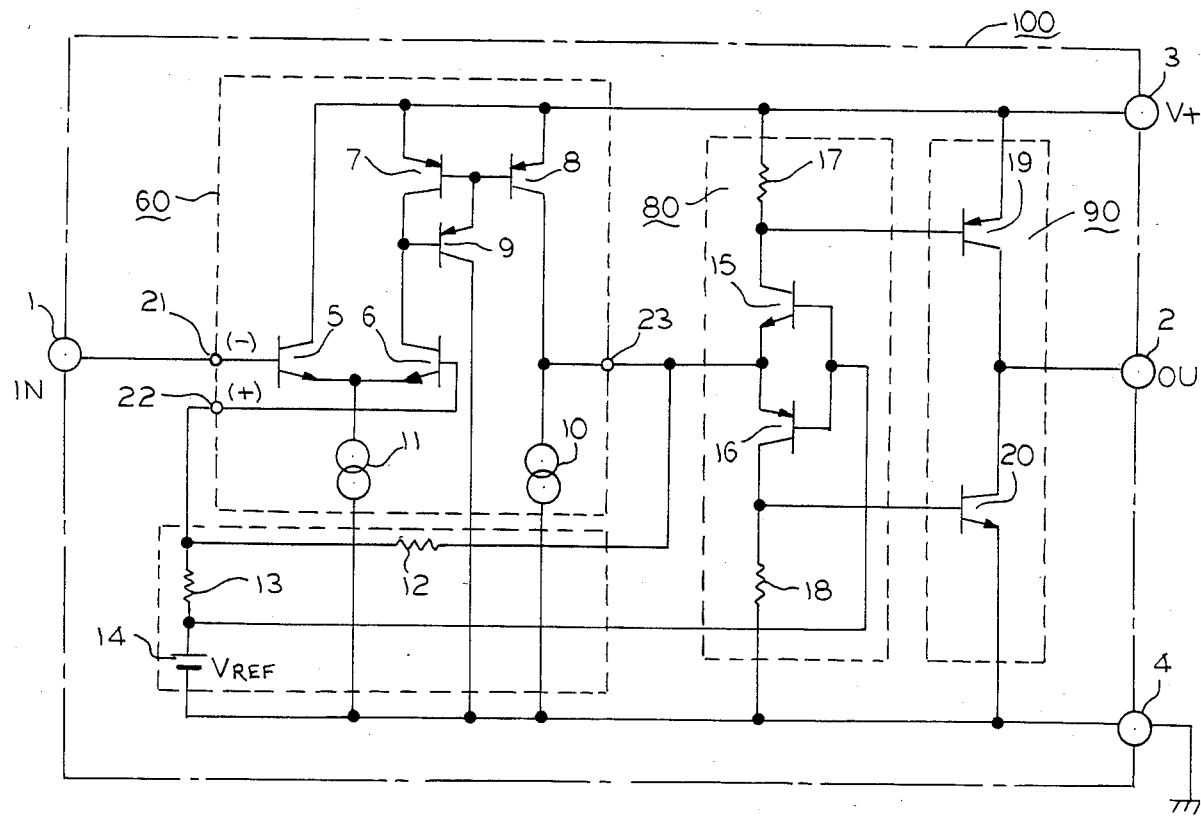
FIG. 1 is a circuit diagram of a preferred embodiment of the present invention.

A comparator circuit in accordance with a preferred embodiment of the present invention is shown in FIG. 1, and is formed as a semiconductor integrated circuit device 100. The device 100 is provided with an input terminal 1, an output terminal 2, a first power supply terminal 3 and a second power supply terminal 4 as external terminals. The first power terminal 3 is supplied with a power supply voltage of V+, and the second power terminal 4 is grounded or supplied with a power supply voltage of V−.

A block 60 in the integrated circuit device 100 constitutes an amplifier operating as a comparator. The amplifier 60 has an inverting input end 21, a non-inverting input end 22 and an output end 23. The inverting input end 21 is connected to the input terminal 1 and further connected to the base of a transistor 5. The transistor 5 cooperates with a transistor 6 to constitute a differential amplifier circuit, the base of the transistor 6 being connected to the non-inverting input end 22. A constant-current source 11 supplies an operating current to the transistors 5 and 6. The collector of the transistor 6 is connected to an active load of current-mirror circuit construction constituted by transistors 7, 8 and 9. The collector of the transistor 8 is connected to a constant-current source 10 and further connected to the output end 23.

A feedback circuit 70 is connected between the output end 23 and the non-inverting input end 22 of the amplifier 60. The feedback circuit 70 comprises resistors 12 and 13 and a reference voltage source 14 which are series-connected between the output end 23 and the grounded terminal 4. The voltage source 14 generates a reference voltage $V_{REF}$. The connecting point between the resistors 12 and 13 is connected to the non-inverting input end 22 of the amplifier 60.

The comparator circuit shown in FIG. 1 further has a voltage-clamping circuit 80 connected to the output end 23 of the amplifier 60, and an output circuit 90. The prior art comparator circuit, however, does not have these circuits 80 and 90. Such a conventional comparator circuit will be explained hereinafter prior to the description of the voltage-clamping circuit 80 and the output circuit 90.

When the voltage level of an input signal supplied to the inverting input end 21 through the input terminal 1 is sufficiently small, the transistor 5 is cut off, and the transistor 6 is ON. Therefore, the transistors 7, 8 and 9 constituting the active load are turned conductive. Consequently, the amplifier 60 generates a first signal for raising the voltage at the output end 23. In the conventional comparator circuit, no voltage-clamping circuit 80 is provided, and the output end 23 is directly connected to the output terminal 2. Therefore, the voltage at the output end 23 of the amplifier 60 is raised to about power supply voltage $V^+$ of the terminal 3 in response to the first signal. Since the feedback circuit 70 having the abovementioned construction is connected between the output end 23 and the non-inverting input end 22, the input end 22 is supplied with a voltage $V_{T1}$ represented by the following equation (1):

$$V_{T1} = \frac{R_{13}}{R_{12} + R_{13}} \cdot (V^+ - V_{REF}) + V_{REF} \quad (1)$$

where, $R_{12}$ and $R_{13}$ represent the resistance values of the resistors 12 and 13, respectively.

In other words, a first threshold voltage $V_{T1}$ is set in the amplifier 60.

When the input signal voltage increases to exceed the first threshold voltage $V_{T1}$ at the non-inverting input end 22, the transistor 5 is turned ON, while the transistor 6 is turned OFF. Accordingly, the transistors 7 to 9 are also turned OFF. Since the output end 23 is connected to the grounded terminal 4 through the current source 10, the amplifier 60 produces a second signal for lowering the voltage at the output end 23. In response to the second signal, the output end 23 takes almost the ground potential, because the conventional comparator circuit has no voltage-clamping circuit 80. As a result, the non-inverting input end 22 of the amplifier 60 is supplied with a voltage $V_{T2}$ represented by the following equation (2):

$$V_{T2} = \frac{R_{12}}{R_{12} + R_{13}} \cdot V_{REF} \quad (2)$$

Thus, when the input signal voltage increases to reach the first threshold voltage $V_{T1}$, a second threshold voltage $V_{T2}$ is set in the amplifier 60. Even if the input signal voltage further increases, there is no change in voltage level at the output end 23. It is apparent from the equations (1) and (2) that the first threshold voltage $V_{T1}$ is larger than the second threshold voltage $V_{T2}$.

When the input signal voltage decreases from a high-voltage level to the voltage $V_{T1}$, there is no change in voltage at the output end 23. This is because the amplifier 60 has the second threshold voltage $V_{T2}$ set therein. When the input signal voltage further decreases to the voltage $V_{T2}$, the transistor 5 is turned OFF, while the transistor 6 is turned ON. Therefore, the voltage at the output end 23 is inverted from the ground potential to the supply voltage $V^+$, and simultaneously the first threshold voltage $V_{T1}$ is supplied to the non-inverting input end 22.

Thus, when the input signal voltage increases from a small voltage level to the first threshold voltage $V_{T1}$, the voltage at the output end 23 of the amplifier 60 is inverted from the supply voltage $V^+$ to the ground potential (0 V). On the other hand, when the input signal voltage decreases from a high voltage level to the second threshold voltage $V_{T2}$, the voltage at the output end 23 is inverted from the ground potential (0 V) to the supply voltage $V^+$. Accordingly, the amplifier 60 and the feedback circuit 70 in combination constitute a comparator circuit having a hysteresis characteristic, and the hysteresis voltage $V_H$ thereof is represented by the following equation (3):

$$V_H = V_{T1} - V_{T2} \qquad (3)$$
$$= \frac{R_{13}}{R_{12} + R_{13}} V^+$$

As will be obvious from the equation (3), the hysteresis voltage $V_H$ is determined by the resistance ratio $$\left( \frac{R_{13}}{R_{12} + R_{13}} \right)$$

between the resistors 12 and 13 and the power supply voltage $V^+$. In other words, the hysteresis voltage $V_H$ is changed in response to the variation in the power supply voltage $V^+$. When the power supply voltage $V^+$ is high the resistance ratio $$\frac{R_{13}}{R_{12} + R_{13}}$$

should be made large to obtain a small hysteresis voltage $V_H$. The resistance ratio $$\left( \frac{R_{13}}{R_{12} + R_{13}} \right)$$

between the resistors 12, 13 formed in a semiconductor integrated circuit device has a larger deviation from a set value as the ratio becomes larger. In other words, the hysteresis voltage $V_H$ has a large deviation. Moreover, the resistor 12 requires a high resistance value, and therefore the area for the resistor 12 on the semiconductor substrate becomes large.

In order to solve the above-mentioned drawbacks, the comparator circuit shown in FIG. 1 is provided with the voltage-clamping circuit 80. The voltage-clamping circuit 80 has transistors 15 and 16 different in conductivity type from each other. The transistor 15 is of NPN type, while the transistor 16 is of PNP type. The emitters of the transistors 15 and 16 are connected to the output end 23 of the amplifier 60, the bases of which are connected to the reference voltage source 14. The collector of the transistor 15 is connected to the power supply terminal 3 through a resistor 17, while the collector of the transistor 16 is connected to the grounded terminal 4 through a resistor 18.

The output circuit 90 has two transistors 19 and 20. The base-emitter path of the PNP transistor 19 is connected in parallel to the resistor 17, and the base-emitter path of the NPN transistor 20 is connected in parallel to the resistor 18. The collectors of the transistors 19, 20 are connected to the output terminal 2.

When the input signal supplied to the input terminal 1 is sufficiently low, the amplifier 60 generates the first signal for raising the voltage at the output end 23. This causes the transistor 16 to turn ON. Consequently, the voltage at the output end 23 takes a voltage $(V_{REF}+V_{BE16})$ which is the sum of the reference voltage $V_{REF}$ of the voltage source 14 and the base-emitter forward voltage $V_{BE16}$ of the transistor 16. The reference voltage $V_{REF}$ and the base-emitter forward voltage $V_{BE16}$ are not virtually changed with the variation in the power supply voltage $V^+$. In other words, the voltage at the output end 23 of the amplifier 60 is clamped at a first stabilized voltage $(V_{REF}+V_{BE16})$ by the voltage-clamping circuit 80. In response to the first stabilized voltage, the feedback circuit 70 generates a voltage $V_{TH(1)}$ represented by the following equation (4):

$$V_{TH(1)} = V_{REF} + \frac{R_{13}}{R_{12} + R_{13}} V_{BE16} \qquad (4)$$

This voltage $V_{TH(1)}$ is supplied to the non-inverting input end 22. In other words, a first threshold voltage $V_{TH(1)}$ is set in the amplifier 60.

By the conduction of transistor 16, a voltage drop occurs across the resistor 18 to turn the transistor 20 ON. Accordingly, the voltage at the output terminal 2 becomes approximately equal to the ground potential.

When the input signal increases to reach the first threshold voltage $V_{TH(1)}$, the amplifier 60 generates the second signal for lowering the voltage at the output end 23. Accordingly, the transistor 16 is turned OFF. The transistor 15, however, is turned ON in response to the second signal. Consequently, the voltage at the output end 23 is clamped at a second stabilized voltage $(V_{REF}-V_{BE15})$ which is obtained by subtracting the base-emitter voltage $V_{BE15}$ of the transistor 15 from the reference voltage $V_{REF}$ of the voltage source 14. Since the transistor 15 is turned ON, the transistor 19 is also turned ON by the voltage drop across the resistor 17. The transistor 20 is turned OFF, since the transistor 16 is cut off. In consequence, a voltage approximately equal to the supply voltage $V^+$ is produced from the output terminal 2.

Since the voltage at the output end 23 of the amplifier 60 is the second stabilized voltage $(V_{REF}-V_{BE15})$, the non-inverting input end 22 is supplied from the feedback circuit 70 with a voltage $V_{TL(1)}$ represented by the following equation (5):

$$V_{TL(1)} = V_{REF} - \frac{R_{13}}{R_{12} + R_{13}} V_{BE15} \quad (5)$$

In other words, the second threshold voltage $V_{TL(1)}$ is set in the amplifier 60. As will be apparent from the equations (4) and (5), the first threshold voltage $V_{TH(1)}$ is larger than the second threshold voltage $V_{TH(1)}$.

When the input signal voltage decreases from a high voltage to reach the second threshold voltage $V_{TL(1)}$ after passing the first threshold voltage $V_{TH(1)}$, the amplifier 60 generates the first signal. Therefore, the transistor 16 is turned on to supply the first threshold voltage $V_{TH(1)}$ to the non-inverting input end 22. At the same time, the voltage at the output terminal 2 becomes the ground potential.

Thus, when the input signal voltage increases from a small voltage level to reach the first threshold voltage $V_{TH(1)}$, the output voltage at the output terminal 2 is inverted from the ground potential to the power supply voltage $V^+$. On the other hand, when the input signal voltage decreases from a high voltage level to reach the second threshold voltage $V_{TL(1)}$, the output voltage at the output terminal 2 is inverted from the supply voltage $V^+$ to the ground potential. In other words, the comparator circuit shown in FIG. 1 has a hysteresis characteristic, and the hysteresis voltage $V_{H(1)}$ thereof is represented by the following equation (6);

$$V_{H(1)} = V_{TH(1)} - V_{TL(1)} \quad (6)$$

$$= \frac{R_{13}}{R_{12} + R_{13}} \cdot (V_{BE16} + V_{BE15})$$

Since the base-emitter voltages of the respective transistors 15 and 16 are substantially equal to each other, the hysteresis voltage $V_{H(1)}$ is eventually represented by the following equation (7):

$$V_{H(1)} = \frac{R_{13}}{R_{12} + R_{13}} \cdot 2V_{BE} \quad (7)$$

As will be obvious from the equation (7), the hysteresis voltage $V_{H(1)}$ of the comparator circuit shown in FIG. 1 is determined by the resistance ratio $$\left( \frac{R_{13}}{R_{12} + R_{13}} \right)$$

between the resistors 12, 13 and the sum ($2V_{BE}$) of the base-emitter forward voltages of the respective transistors 15, 16, and hence is independent of the power supply voltage. In other words, even if the power supply voltage is varied, the hysteresis voltage $V_{H(1)}$ is kept substantially constant. Moreover, since the hysteresis voltage $V_{H(1)}$ is not affected by the magnitude of the power supply voltage, the resistors 12, 13 can be formed in a semiconductor integrated circuit device so that the resistance ratio therebetween may have a considerably small deviation. In addition, there is no increase in the space for the resistors on the semiconductor substrate.

As shown by the equations (4) and (5), the first threshold voltage $V_{TH}$ is higher than the reference voltage $$V_{REF} \text{ by } \frac{R_{13}}{R_{12} + R_{13}} V_{BE},$$

and the second threshold voltage $V_{TL}$ is lower than the reference voltage $$V_{REF} \text{ by } \frac{R_{13}}{R_{12} + R_{13}} V_{BE}.$$

In other words, the first and second threshold voltages $V_{TH}$, $V_{TL}$ are set at voltage values upwardly and downwardly offset from the reference voltage $V_{REF}$ by the same voltage level, respectively. Accordingly, the setting of these two threshold voltages is facilitated.

If the input terminal 1 is connected to the non-inverting input end 22 of the amplifier 60 and the feedback circuit 70 is coupled to the inverting input end 21, the variation in the voltage at the output terminal 2 to the input signal voltage is opposite to the above. The output terminal 2 may be connected to the output end 23 of the amplifier 60. In this case, the output circuit 90 and the resistors 17, 18 are omitted.

Figure 2:
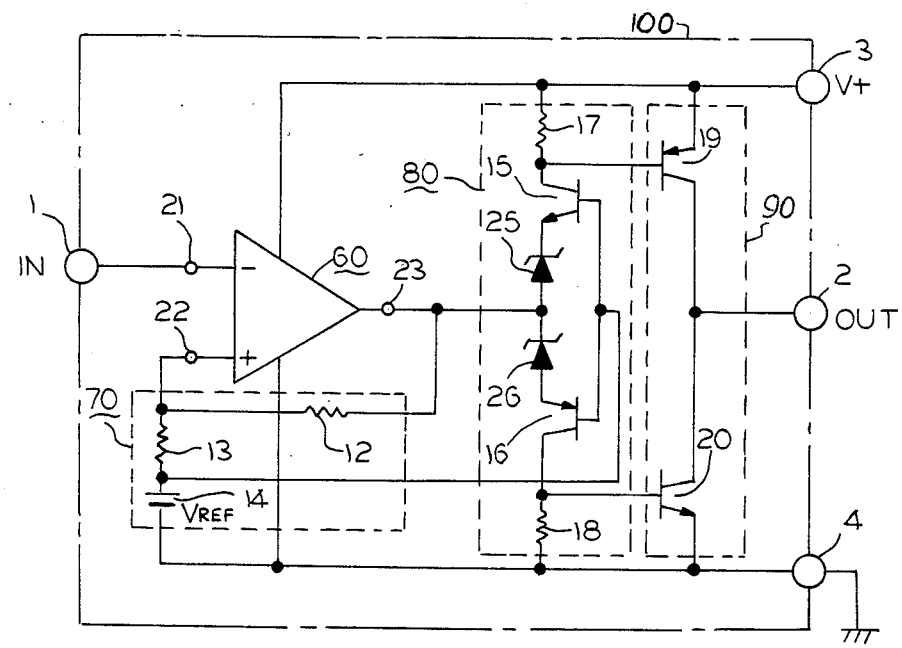
FIGS. 2 to 4 are circuit diagrams of other preferred embodiments of the present invention, respectively.

Referring now to FIG. 2, second preferred embodiment of the present invention will be described. In FIG. 2, the same constituents as those in the embodiment shown in FIG. 1 are represented by the same reference numerals as those in FIG. 1 to omit the further description thereof. The second embodiment differs from the first embodiment in that the voltage-clamping circuit 80 further has two zener diodes 25 and 26. The emitter of the transistor 15 is connected to the output end 23 of the amplifier 60 through the zener diode 25. On the other hand, the emitter of the transistor 16 is connected to the output end 23 through the zener diode 26.

Accordingly, if the breakdown voltages of the zener diodes 25, 26 are $V_{Z25}$, $V_{Z26}$, respectively, first and second stabilized voltages are represented by ($V_{REF}+V_{BE16}+V_{Z26}$) and ($V_{REF}+V_{BE15}+V_{Z25}$), respectively. As a result, the first and second threshold voltages $V_{TH(2)}$, $V_{TL(2)}$ are represented by the following equations (8) and (9), respectively, and the hysteresis voltage $V_{H(2)}$ is represented by the following equation (10):

$$V_{TH(2)} = V_{REF} + \frac{R_{13}}{R_{12} + R_{13}} \cdot (V_{BE16} + V_{Z26}) \quad (8)$$

$$V_{TL(2)} = V_{REF} - \frac{R_{13}}{R_{12} + R_{13}} \cdot (V_{BE15} + V_{Z25}) \quad (9)$$

$$V_{H(2)} = \frac{R_{13}}{R_{12} + R_{13}} \cdot 2(V_{BE} + V_Z) \quad (10)$$

Since the breakdown voltage $V_{Z25}$, $V_{Z26}$ of the respective zener diodes 25, 26 are substantially equal to each other, the equation (10) can be obtained.

As will be apparent from the equations (8), (9) and (10), the first and second threshold voltages $V_{TH(2)}$, $V_{TL(2)}$ and the hysteresis voltage $V_{H(2)}$ are independent of the supply voltage $V^+$, respectively. Additionally, the temperature coefficient of the base-emitter forward voltage $V_{BE}$ and that of the breakdown voltages $V_Z$ are different in polarity from each other and approximately equal in magnitude to each other. Therefore, it is possible to obtain the hysteresis voltage and two threshold voltages of a considerably small temperature dependence.

Also in the circuit shown in FIG. 2, some modifications may be made. It is possible to employ one or more diodes in place of the zener diodes 25, 26.

Figure 3:
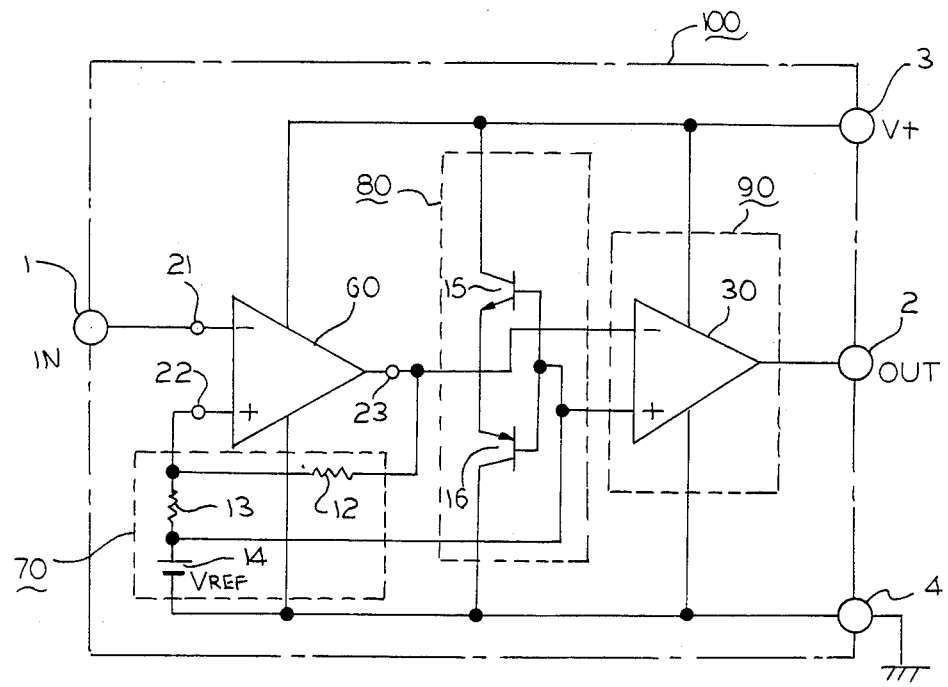

FIG. 3 shows a third preferred embodiment of the invention, which differs from the embodiment shown in FIG. 1 in the construction of the output circuit 90. The output circuit 90 shown in FIG. 3 is constituted by a comparator 30. The inverting input end of the comparator 30 is connected to the output end 23 of the amplifier 60, and the non-inverting input end thereof is supplied with the reference voltage $V_{REF}$. Accordingly, the comparator 30 compares the voltage at the output end 23 of the amplifier 60 with the reference voltage $V_{REF}$ to generate an output voltage of the power supply voltage V+ or ground potential at the output terminal 2. The resistors 17, 18 are eliminated. The comparator 30 may be formed by a differential amplifier.

The first and second threshold voltages $V_{TH(3)}$, $V_{TL(3)}$ and the hysteresis voltage $V_{H(3)}$ of the comparator circuit shown in FIG. 3 are the same as those of the comparator circuit shown in FIG. 1 and are represented by the equations (4), (5) and (7), respectively.

If the non-inverting input end of the comparator 30 is connected to the output end 23 of the comparator 60 and the inverting input end is supplied with the reference voltage $V_{REF}$, the change in the output voltage to the input signal voltage is opposite to the above. In accordance with the circuit shown in FIG. 2, zener diodes can be inserted between the emitters of the respective transistors 15, 16 and the output end 23. In the circuit shown in FIG. 3, the transistors 15, 16 can be replaced with at least one diode, respectively. More specifically, the cathode of one diode and the anode of the other diode are connected to the output end 23, and the anode of the one diode and the cathode of the other diode are connected to the reference voltage source 14.

Figure 4:
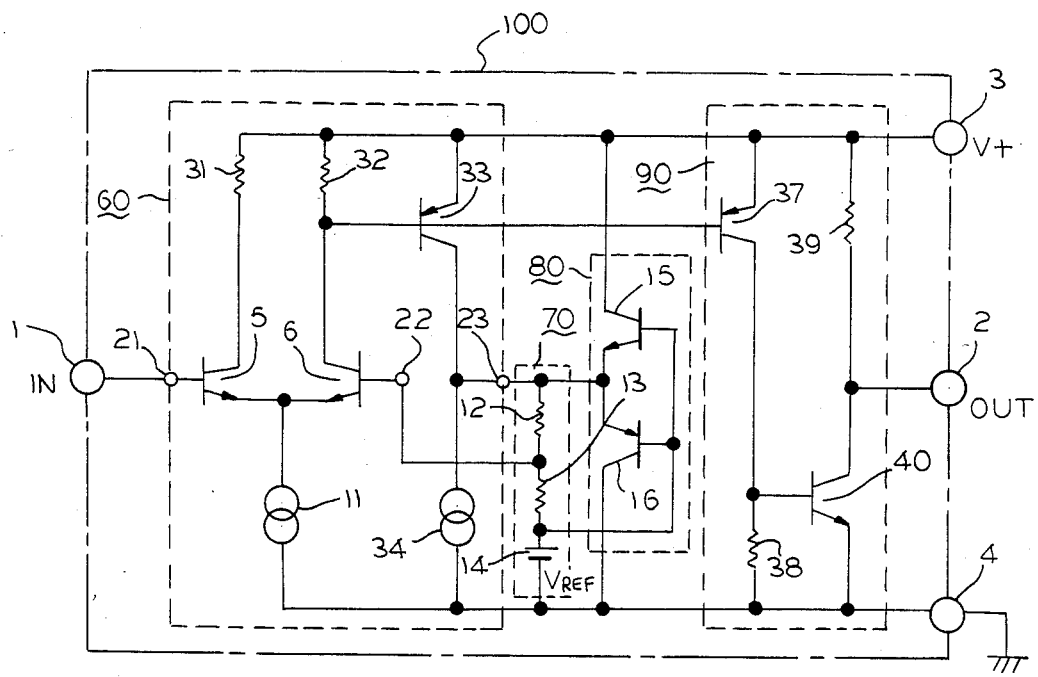

FIG. 4 shows a fourth preferred embodiment of the present invention, which differs from the embodiment shown in FIG. 1 in the constructions of the amplifier 60 and the output circuit 90. The transistors 5 and 6 in the amplifier 60 are provided with load resistors 31, 32 instead of the active load, respectively. The voltage across the resistor 32 is supplied to the base of a transistor 33 having a constant-current source 34 as a load. The collector of the transistor 33 is defined as the output end 23 of the amplifier 60. The voltage across the resistor 32 is further supplied to a transistor 37 in the output circuit 90. The transistor 37 serves as an inverting-amplifier having a resistor 38 as a collector load. The voltage across the resistor 38 is fed to a transistor 40. The transistor 40 also serves as an inverting-amplifier having a resistor 39 as a collector load, and the collector of the transistor 40 is connected to the output terminal 2.

When the transistor 6 is turned ON, the transistors 33 and 37 are also turned ON. Consequently, the first threshold voltage $V_{TH(4)}$ represented by the equation (4) is set in the amplifier 60. At this time, the transistor 40 is also turned ON; hence, the voltage at the output terminal 2 becomes substantially equal to the ground potential. When the transistor 6 is cut OFF, the transistors 33, 37 are also cut OFF. Consequently, the second threshold voltage $V_{TL(4)}$ represented by the equation (5) is set in the amplifier 60. Since the transistor 40 is also turned OFF, the voltage at the output terminal 2 becomes substantially equal to the power supply voltage V+.

The comparator circuit shown in FIG. 4 has the hysteresis voltage $V_{H(4)}$ represented by the equation (7), which is substantially constant regardless of the variation in the power supply voltage V+.

The reference voltage source 14 shown in FIGS. 1 to 4 is constituted by a current source and at least one constant-voltage element such as a diode or zener diode, or may be constituted by so-called "a band-gap regulator".

As has been described, the comparator circuit according to the invention is suitable for a semiconductor integrated circuit device, and is provided with a hysteresis voltage substantially independent of the power supply voltage.

Although the invention has been described through specific embodiments, it is to be noted here that the described embodiments are not exclusive and vhas been described through specific embodiments, it is to be noted here that the described embodiments are not exclusive and various changes and modifications may be imparted thereto without departing from the spirit and scope of the invention. For example, a reference voltage source for biasing the bases of the respective transistors 15 and 16 may be provided separately from the reference voltage source 14. In addition, the transistors 15 and 16 may be biased by two independent voltage sources, respectively.

What is claimed is:

1. A comparator circuit comprising an amplifier having first and second input ends and an output end and comparing an input signal voltage supplied to said first input end with a threshold voltage supplied to said second input end to generate a first signal of a higher voltage at said output end or a second signal of a lower voltage at said output end, a voltage-clamping circuit clamping the voltage at said output end of said amplifier at a first stabilized voltage in response to said first signal and that at a second stabilized voltage in response to said second signal, and a feedback circuit generating a first feedback voltage corresponding to said first stabilized voltage and a second feedback voltage corresponding to said second stabilized voltage to supply one of said first and second feedback voltages to said second input end of said comparator as said threshold voltage.

2. The comparator circuit as claimed in claim 1, wherein said voltage-clamping circuit comprises a first and a second transistors whose conductivity types are different from each other, emitters of said first and second transistors being coupled to the output end of said amplifier, bases of said first and second transistors being supplied with a bias voltage, and said first and second transistors being turned on in response to said first and second signals respectively.

3. The comparator circuit as claimed in claim 1, wherein said voltage-clamping circuit comprises a first and a second voltage generators, said first voltage generator responding to said first signal to supply said first stabilized voltage to the output end of said comparator, and said second voltage generator responding to said second signal to supply said second stabilized voltage to the output end of said comparator.

4. A circuit for comparing an input voltage with a first or a second threshold voltage, said first and second threshold voltages being different from each other, said circuit comprising means responsive to a voltage level of said input voltage and one of said first and second threshold voltages for generating a first or a second signal at its output end, said first signal being representative of increase in a voltage at said output end, said second signal being representative of decrease in the voltage at said output end, means for clamping the voltage at said output end of said generating means at a first stabilized voltage in response to said first signal and that at a second stabilized voltage in response to said second signal, and means for producing said first threshold voltage in response to said first stabilized voltage or said second threshold voltage in response to said second stabilized voltage.

5. The circuit as claimed in claim 4, wherein said clamping means comprises first and second voltage developing means, said first voltage developing means responding to said first signal to develop said first stabilized voltage, and said second voltage developing means responding to said second signal to develop said second stabilized voltage.

6. The circuit as claimed in claim 4, wherein said clamping means comprises first and second transistors of different conductivity types from each other, emitters of said first and second transistors being coupled to said output end of said generating means, and bases of said first and second transistors being supplied with a constant bias voltage.

7. The circuit as claimed in claim 6, wherein said generating means comprises a comparator having first input end supplied with said input voltage and a second input end supplied with said first and second threshold voltages, and said producing means comprises a feedback circuit having first and second resistors and a reference voltage source, said first resistor being coupled between the second input end and the output end of said comparator, said second resistor being coupled between the second input end of said comparator and said reference voltage source, and said constant bias voltage being derived from said reference voltage source.

8. A circuit comprising means for comparing an input voltage with a reference voltage, said reference voltage being produced by making use of an output voltage of said comparing means, thereby being changed in accordance with the variation in the output voltage of said comparing means, and means for clamping the output voltage of said comparing means at a first or a second stabilized voltage in response to an output of said comparing means, whereby said reference voltage having a voltage level corresponding to said first or second stabilized voltage.

9. A circuit comprising a comparator having a first input end supplied with an input voltage, a second input end and an output end, a feedback circuit having a first resistor coupled between the output and second input ends of said comparator, a reference voltage source and a second resistor coupled between the second input end of said comparator and said reference voltage source, and a voltage-clamping circuit including a first transistor having an emitter connected to said output end of said comparator and a second transistor having an emitter connected to said output end of said comparator and a conductivity type different from that of said first transistor, bases of said first and second transistors being supplied with a constant voltage, respectively.

10. The circuit as claimed in claim 9, further comprising an output circuit generating an output voltage and having a third and a fourth transistors whose collectors are connected to each other, said voltage-clamping circuit further including a third and a fourth resistors connected to collectors of said first and second transistors, respectively, a voltage drop across said third resistor being supplied between a base and an emitter of said third transistor, a voltage drop across said fourth resistor being supplied between a base and an emitter of said fourth transistor, and said third transistor having a conductivity type different from that of said fourth transistor.

11. The circuit as claimed in claim 9, wherein said voltage-clamping circuit further includes at least one first constant voltage element and at least one second constant voltage element, said first constant voltage element being connected between the output end of said comparator and the emitter of said first transistor, and said second constant voltage element being connected between the output end of said comparator and the emitter of said second transistor.

12. The circuit as claimed in claim 9, further comprising an additional comparator, said additional comparator comparing a voltage at the output end of said comparator with said constant voltage to generate an output voltage.

13. The circuit as claimed in claim 9, further comprising an output circuit having at least one first amplifier, said comparator further having a differential amplifier and at least one second amplifier, said differential amplifier being supplied with voltages via said first and second input ends of said comparator, said second amplifier being coupled between said differential amplifier and the output end of said comparator, and said first amplifier receiving an output of said differential amplifier to generate an output voltage.

14. The circuit as claimed in claim 9, wherein said constant voltage is generated from said reference voltage source.

* * * * *